(12) United States Patent
Kim et al.

(10) Patent No.: US 7,450,667 B2
(45) Date of Patent: Nov. 11, 2008

(54) APPARATUS AND METHOD FOR DECODING DATA OF UNKNOWN FRAME LENGTH

(75) Inventors: Jae-Hong Kim, Seoul (KR); Jun-Jin Kong, Sungnam (KR); Sung-Han Choi, Anyang (KR)

(73) Assignee: Samsung Electronics Co., Ltd., Suwon (KR)

(*) Notice: Subject to any disclaimer, the term of this patent is extended or adjusted under 35 U.S.C. 154(b) by 878 days.

(21) Appl. No.: 09/897,732

(22) Filed: Jul. 3, 2001

(65) Prior Publication Data

US 2002/0057747 A1 May 16, 2002

(30) Foreign Application Priority Data

Nov. 10, 2000 (KR) ................................. 2000-66862

(51) Int. Cl.
*H03D 1/00* (2006.01)
*H03M 13/03* (2006.01)

(52) U.S. Cl. .................... 375/341; 375/265; 714/795

(58) Field of Classification Search ................ 375/225, 375/262, 265, 316, 340, 341; 714/704, 758, 714/786, 794, 795
See application file for complete search history.

(56) References Cited

U.S. PATENT DOCUMENTS

| | | | | |
|---|---|---|---|---|
| 5,396,516 A | * | 3/1995 | Padovani et al. | ............ 375/225 |
| 5,509,020 A | * | 4/1996 | Iwakiri et al. | ............... 714/704 |
| 5,928,377 A | | 7/1999 | Doran et al. | |
| 6,108,384 A | | 8/2000 | Okumura et al. | |
| 6,438,119 B1 | * | 8/2002 | Kim et al. | ................... 370/335 |

FOREIGN PATENT DOCUMENTS

| | | |
|---|---|---|
| EP | 0817440 A2 | 1/1998 |
| EP | 1187342 A2 | 3/2002 |
| JP | 9-232971 A | 9/1997 |
| JP | 2000-196468 A | 7/2000 |
| WO | WO 97/50219 A1 | 12/1997 |

OTHER PUBLICATIONS

"3$^{rd}$ Generation Partnership Project (3GPP); Technical Specification Group Radio Access Network Multiplexing and Channel Coding (FDD) (3G TS 25.212 Version 3.0.0)" 3G TS 25 212 V3.0.0,XX,XX, Oct. 1999, XP002149187.

(Continued)

*Primary Examiner*—Kevin Y Kim
(74) *Attorney, Agent, or Firm*—Sughrue Mion, PLLC (57) ABSTRACT

An apparatus decodes data of unknown frame length. The decoding apparatus includes a preliminary decoding part and a decoded data outputting part. The preliminary decoding part decodes data into preliminarily decoded data according to each of the possible frame lengths. The decoded data outputting part selectively outputs data among the preliminary decoding data that correspond to a detected frame length. Accordingly, memory can be efficiently utilized, and decoding efficiency deterioration is prevented.

10 Claims, 6 Drawing Sheets

OTHER PUBLICATIONS

Y. Okumura et al., "Variable-Rate Data Transmission with Blind Rate Detection for Coherent DS-CDMA Mobile Radio", IEICE Transactions on Communications, Institute of Electronics Information and Comm. Eng. Tokyo, JP, vol. E81-B, No. 7, Jul. 1, 1998, pp. 1365-1372, XP000790169.

R. Cypher et al., "Generalized Trace-Back Techniques for Survivor Memory Management in the Viterbi Algorithm", Journal of VLSI Signal Processing Systems for Signal, Image, and Video Technology, Kluwer Academic Publishers, Dordrecht, NL, vol. 5, No. 1, 1993, pp. 85-94, XP000364288.

B. Sbim et al., "Pipelined VLSI Architecture of the Viterbi Decoder for IMT-2000" Conference Proceedings Article, vol. 1A, Dec. 5, 1999, pp. 158-162, XP010373290.

* cited by examiner

APPARATUS AND METHOD FOR DECODING DATA OF UNKNOWN FRAME LENGTH

BACKGROUND OF THE INVENTION

1. Field of the Invention

The present invention relates to an apparatus and method for decoding data of an unknown frame length, and more particularly to an apparatus and method for decoding data of an unknown frame length capable of selectively outputting appropriate data from preliminarily decoded data which are decoded corresponding to each of the possible data frame lengths.

2. Description of the Related Art

In a digital communication system, a Viterbi Decoder generally decodes Tree codes which are used to correct data errors. The Tree codes are transmitted mainly by two methods according to the standard of the communication system. One method is to transmit the data successively, without limitation on the length of the data frame. The other method is to transmit the data with a uniform predetermined length of data frame.

Figure 1:
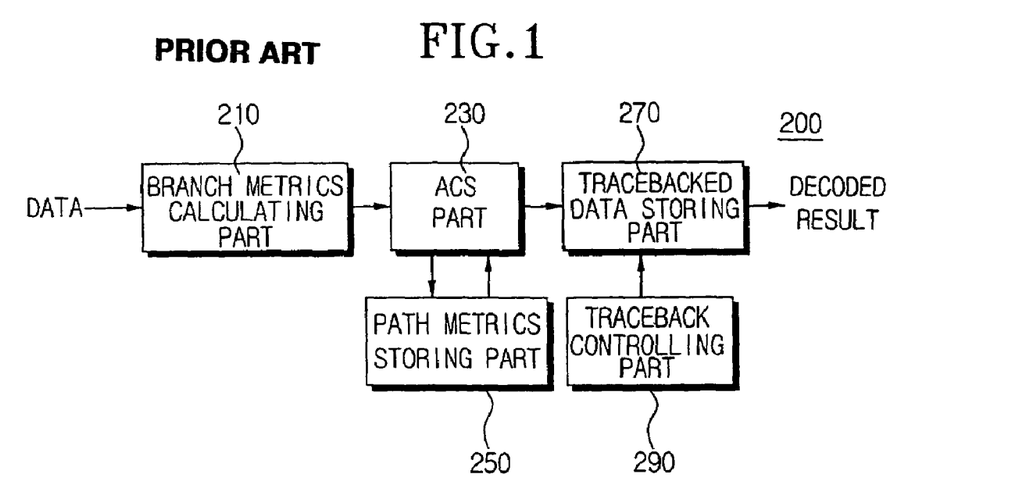
FIG. 1 is a block diagram showing a conventional Viterbi decoder.

FIG. 1 is a block diagram illustrating a conventional Viterbi Decoder. The Viterbi Decoder 200 includes a branch metrics processor 210, an ACS part (Add, Compare & Select part) 230, a path metrics storing part 250, a traceback data storing part 270, and a traceback control part 290. The branch metrics processor 210 calculates a set of branch metrics by comparing received data with a standard level. The ACS part 230 obtains a path metrics value of a current state by adding path metrics of a previous state to branch metrics input from the branch metrics processor 210, determines path selection data with the path metrics value, and outputs such determined data path selection to the traceback data storing part 270. The ACS part 230 also performs a controlling operation to ensure no overflow of path metrics values of the respective states. The path metrics storing part 250 stores the path metrics values of the respective states which are calculated by the ACS part 230. The path selection data is stored in the traceback data storing part 270, and trace-backed and decoded into output signals of the Viterbi Decoder 200 under the control of the traceback control part 290.

Figure 2:
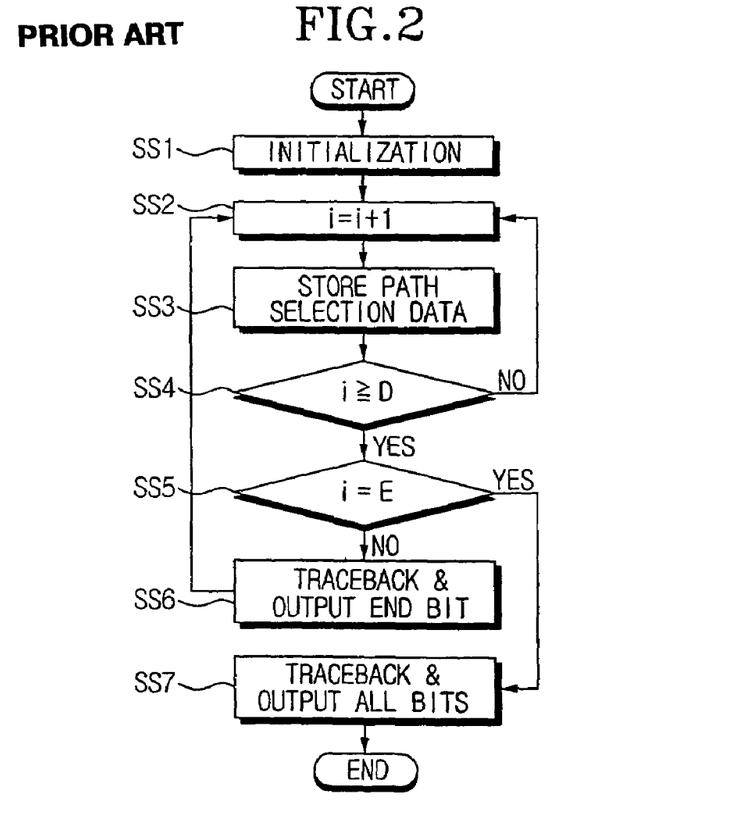
FIG. 2 is a flowchart for explaining a method of controlling a traceback operation of the Viterbi decoder of FIG. 1.

Referring to FIG. 2, when there are a regular frame length (E) and a decoding depth (D), the control operation of the traceback control part 290 of the Viterbi Decoder 200 (FIG. 1) are as follows. First, a parameter (i) for counting data input into the traceback data storing part 270 is initialized (step SS1). Then the parameter (i) is increased (step SS2). Next, i-th path selection data is stored in the traceback data storing part 270 (step SS3). Then the parameter (i) is compared with the decoding depth (D) (step SS4). If the parameter (i) is determined to be smaller than the decoding depth (D) in the decoding depth comparing step (step SS4), the parameter increasing step (SS2) is performed. That is, until the D-th data is input, the data input to the traceback data storing part 270 are continuously stored in the traceback data storing part 270.

If the parameter (i) equals to, or is greater than the decoding depth (D) in the decoding depth comparing step (SS4), a frame end checking step (step SS5) is performed, that is, the parameter (i) is compared with the frame length (E). The frame end checking step (SS5) checks whether the input data is the end data of the data frame. If the input data is not the end data of the data frame in the frame end checking step (SS5), in the next step (step SS6), the data stored in the traceback data storing part 270 are trace-backed, and the end data of the trace-backed data is output as the output data of the Viterbi decoder 200, and the parameter increasing step (SS2) is performed.

In the meantime, if the input data is the end data of the frame, i.e., the E-th data in the frame end checking step (SS5), in the next step (SS7), the data stored in the traceback data storing part 270 are trace-backed, and all the trace-backed data bits are output. Accordingly, the decoding operation of the Viterbi decoder is completed.

The above-described decoder, however, cannot efficiently decode data of unknown frame length. That is, when decoding data of unknown frame length, the conventional decoder needs to first detect the frame length by using a Cyclic Redundancy Check (CRC), zero path metrics, and minimum path metrics, or the like. In addition to the CRC, zero path metrics, and minimum path metrics for detecting the frame length of the data, another inconvenience is brought in that the decoding has to be repetitiously performed corresponding to each of the possible data frame lengths. Accordingly, since decoding has to be performed corresponding to the number (n) of possible frame lengths, decoding efficiency is deteriorated. Still another problem is that the decoder requires considerably large memory capacity, since there has to be a separate storing part for storing the decoded data corresponding to each of the possible frame lengths.

SUMMARY OF THE INVENTION

The present invention has been made to overcome the above-mentioned problems of the related art, and accordingly, it is an object of the present invention to provide an apparatus capable of accurately decoding data of unknown frame length.

Another object of the present invention is to provide a method for decoding data of unknown frame length, without deteriorating the decoding efficiency.

Yet another object of the present invention is to provide a method for decoding data of unknown frame length, capable of utilizing a memory efficiently.

The first object is accomplished by an apparatus for decoding data of unknown frame length according to the present invention, including a preliminary decoding part for decoding input data into preliminarily decoded data according to each of the possible frame lengths; and a decoded data outputting part for selectively outputting data that correspond to a frame length detected from the input data, among the preliminarily decoded data which are decoded by the preliminary decoding part according to each of the possible frame lengths.

The preliminary decoding part includes a branch metrics calculating part for calculating a set of branch metrics by comparing the input data with a standard level; an ACS (Adding, Calculating & Selecting) part for obtaining path metrics of a current state by adding path metrics of a previous state to the set of branch metrics, and from the path metrics, selectively outputting an optimum path of the current state as path selection data; a path metrics storing part for storing the path metrics of the current state calculated by the ACS part; a tracebacked data storing part for storing the path selection data output from the ACS part, and tracebacking the path selection data, and sequentially outputting the tracebacked data as preliminarily decoded data; and a traceback controlling part for controlling the tracebacking of the tracebacked data storing part according to each of the possible frame lengths.

The decoded data outputting part includes a frame length determining part for detecting the frame length based on the input data; an output storing part for storing the preliminarily decoded data output from the tracebacked data storing part; and an output controlling part for controlling the output storing part so as to output decoded data corresponding to the detected frame length.

The second and the third objects are accomplished by a method for decoding data of unknown frame length according to the present invention, including the steps of: (a) decoding the input data into preliminarily decoded data according to each of the possible frame lengths; and (b) selectively outputting data corresponding to the frame length detected based on the input data, among the preliminarily decoded data which are decoded according to each of the possible frame lengths.

The preliminarily decoding step (a) includes the sub-steps of (a1) calculating a set of branch metrics by comparing the input data with a standard level; (a2) obtaining path metrics of a current state by adding path metrics of a previous state to the set of branch metrics, and from the path metrics, selectively outputting an optimum path of the current state as path selection data; (a3) storing the path selection data; and (a4) tracebacking the path selection data according to each of the possible frame lengths, and sequentially outputting the tracebacked data as preliminarily decoded data.

The tracebacking step (a4) includes the sub-steps of (a41) initializing a data parameter for counting the path selection data, a frame length indicating parameter for indicating the possible frame lengths, and a frame length parameter for indicating the possible frame lengths; (a42) increasing the data parameter; (a43) storing path selection data corresponding to the data parameter; (a44) comparing the data parameter with the frame length parameter; (a45) if the data parameter is different from the frame length parameter, comparing the data parameter with a decoding depth, and, if the data parameter is smaller than the decoding depth, performing the data parameter increasing sub-step (a42); (a46) if the data parameter equals to, or is greater than the decoding depth, firstly tracebacking the path selection data, and sequentially outputting a lastly tracebacked bit of the data as first preliminarily decoded data, and performing the data parameter increasing sub-step (a42); (a47) if the data parameter equals the frame length parameter, secondly tracebacking the path selection data, and sequentially outputting all the tracebacked bits of data as second preliminarily decoded data; (a48) after completion of the sub-step (a47), comparing the frame length parameter with a longest possible frame length, and, if the frame length parameter equals to the longest possible frame length, ending the tracebacking step (a4); and (a49) if the frame length parameter is different from the longest possible frame length, increasing the frame length indicating parameter, and performing the data parameter increasing sub-step (a42).

The decoded data outputting step (b) includes the sub-steps of (b1) detecting a frame length from the input data; and (b2) among the first and second preliminarily decoded data output in the sub-steps (a46 and a47), selectively outputting data corresponding to the detected frame length, as final decoded data.

It is preferable that the frame length determining sub-step (b1) detects the frame length by using one of a Cyclic Redundancy Check, a zero path metric, and a minimum path metric.

The decoded data outputting step (b2) includes the sub-steps of (b21) initializing a preliminarily decoded data indicating parameter; (b22) increasing the preliminarily decoded data indicating parameter; (b23) if the preliminarily decoded data indicating parameter is smaller than the detected frame length, selectively outputting the data, among the first preliminarily decoded data, that are indicated by the preliminarily decoded data indicating parameter, and performing the preliminarily decoded data indicating parameter increasing sub-step (b22); and (b24) if the preliminarily decoded data indicating parameter equals the detected frame length, selectively outputting the data, among the first and the second preliminarily decoded data, that are indicated by the frame length indicating parameter.

BRIEF DESCRIPTION OF THE DRAWINGS

The objects and advantages of the present invention will become clearer by explaining the preferred embodiment of the present invention in greater detail with reference to the attached drawings, in which.

DETAILED DESCRIPTION OF THE PREFERRED EMBODIMENT

The objects and other advantages of the present invention will become more apparent from a better understanding of the preferred embodiment described below, with reference to the attached drawings.

Figure 3:
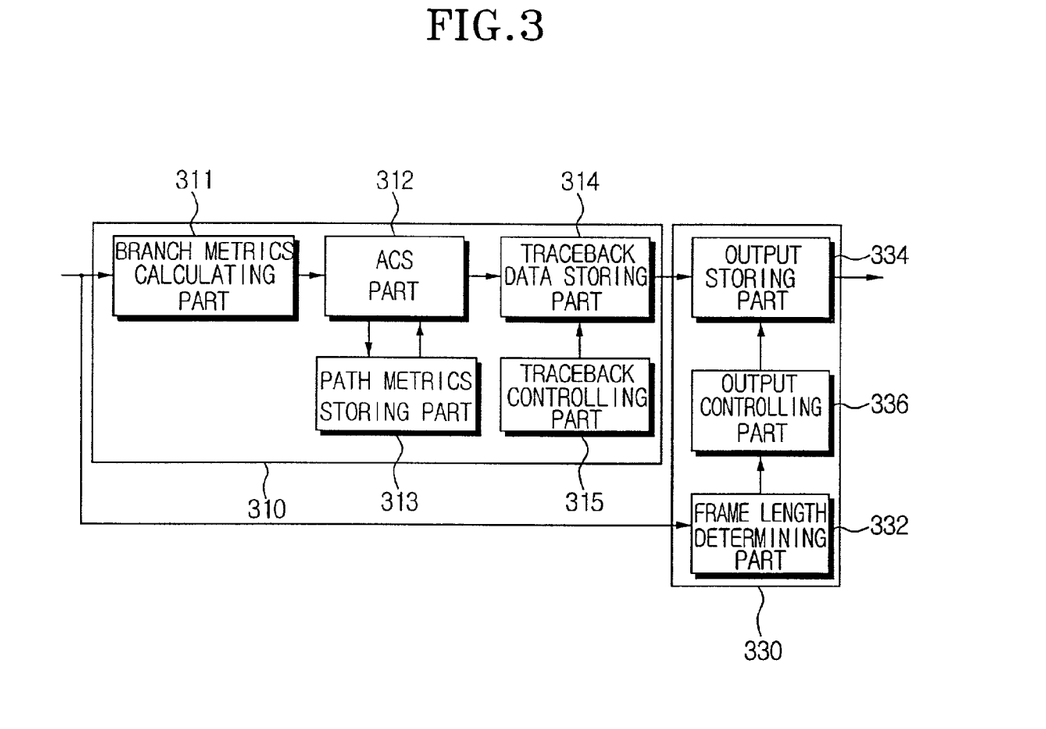
FIG. 3 is a block diagram showing an apparatus for decoding data of unknown frame length according to the present invention.
Figure 4:
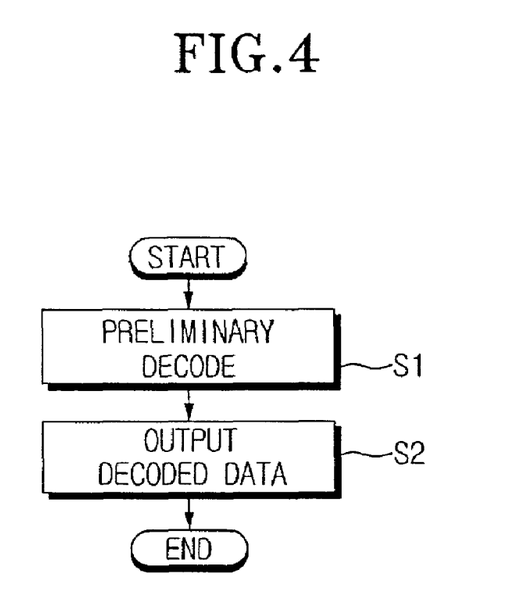
FIG. 4 is a flowchart explaining a method of decoding data of unknown frame length according to the present invention as applied to FIG. 3.

As shown in FIG. 3, a decoding apparatus for decoding data of unknown frame length according to the present invention includes a preliminary decoding part 310, and a decoded data outputting part 330. The preliminary decoding part 310 decodes input data into preliminarily decoded data corresponding to each of the possible frame lengths. The decoded data outputting part 330 selectively outputs the preliminary decoded data that correspond to a data frame length detected from the input data.

The preliminary decoding part 310 includes a branch metrics calculating part 311, an ACS part 312, a path metrics storing part 313, a tracebacked data storing part 314, and a traceback controlling part 315. The branch metrics calculating part 311 calculates a set of branch metrics by comparing the input data with a standard level. The ACS part 312 obtains path metrics of a current state, by adding branch metrics of the current state to the path metrics of previous state. Further, from the path metrics of the current state, the ACS part 312 selectively outputs an optimum path of the respective states as path selection data. The path metrics storing part 313 stores the path metrics of the respective states calculated by the ACS part 312. The tracebacked data storing part 314 stores the path selection data output from the ACS part 312, tracebacks the path selection data, and outputs preliminarily decoded data. The traceback controlling part 315 controls the traceback operation of the tracebacked data storing part 314 according to the respective possible data frame lengths. The controlling operation of the traceback controlling part 315 will be described in detail when describing the decoding method of the present invention.

The decoded data outputting part 330 includes a frame length determining part 332, an output storing part 334, and an output controlling part 336. Based on the input data, the frame length determining part 332 detects a data frame length. The frame length can be detected by a generally known method, i.e., by using a Cyclic Redundancy Check (CRC), zero path metrics, and minimum path metrics. The output storing part 334 stores preliminarily decoded data output from the tracebacked data storing part 314 under the control of the traceback controlling part 315. The output controlling part 336 controls the output storing part 334 so as to output decoded data according to the detected frame length. The control operation of the output controlling part 336 will be described in greater detail below.

The method for decoding data of unknown frame length according to the present invention will be described in greater detail with reference to FIGS. 4 through 7. First, referring to FIG. 4, the decoding method for decoding data of unknown frame length includes a preliminary decoding step (step S1), and a decoded data outputting step (step S2). The preliminary decoding step (S1) decodes the input data into preliminarily decoded data according to the respective possible frame lengths. The decoded data outputting step (S2) selectively outputs the preliminarily decoded data that correspond to the frame length detected from the input data.

Figure 5A:
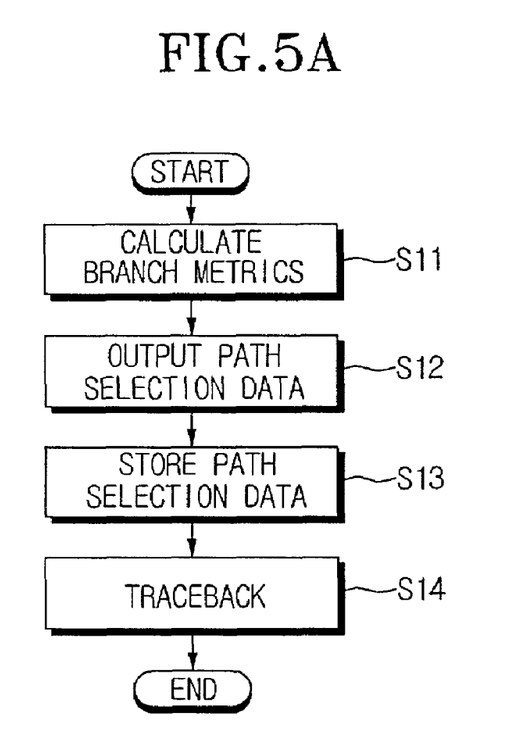
FIG. 5A is a flowchart explaining in detail a preliminary decoding process of FIG. 4.

Referring now to FIG. 5A, the preliminary decoding step (S1) includes a branch metrics calculating step (step S11), a path selection data outputting step (step S12), a path selection data storing step (step S13), and a tracebacking step (step S14). The branch metrics calculating step (S11) calculates a set of branch metrics by comparing the data with a standard level. The path selection data outputting step (S12) obtains path metrics of current state by adding a set of branch metrics of the current state, to the path metrics of the previous state. Based on the path metrics, the path selection data outputting step (S12) selectively outputs an optimum path of the current state as path selection data. The path selection data storing step (S13) stores the path selection data which is output in the path selection data outputting step (S12). The tracebacking step (S14) tracebacks the path selection data according to the respective possible frame lengths and outputs the tracebacked data as preliminarily decoded data.

Figure 5B:
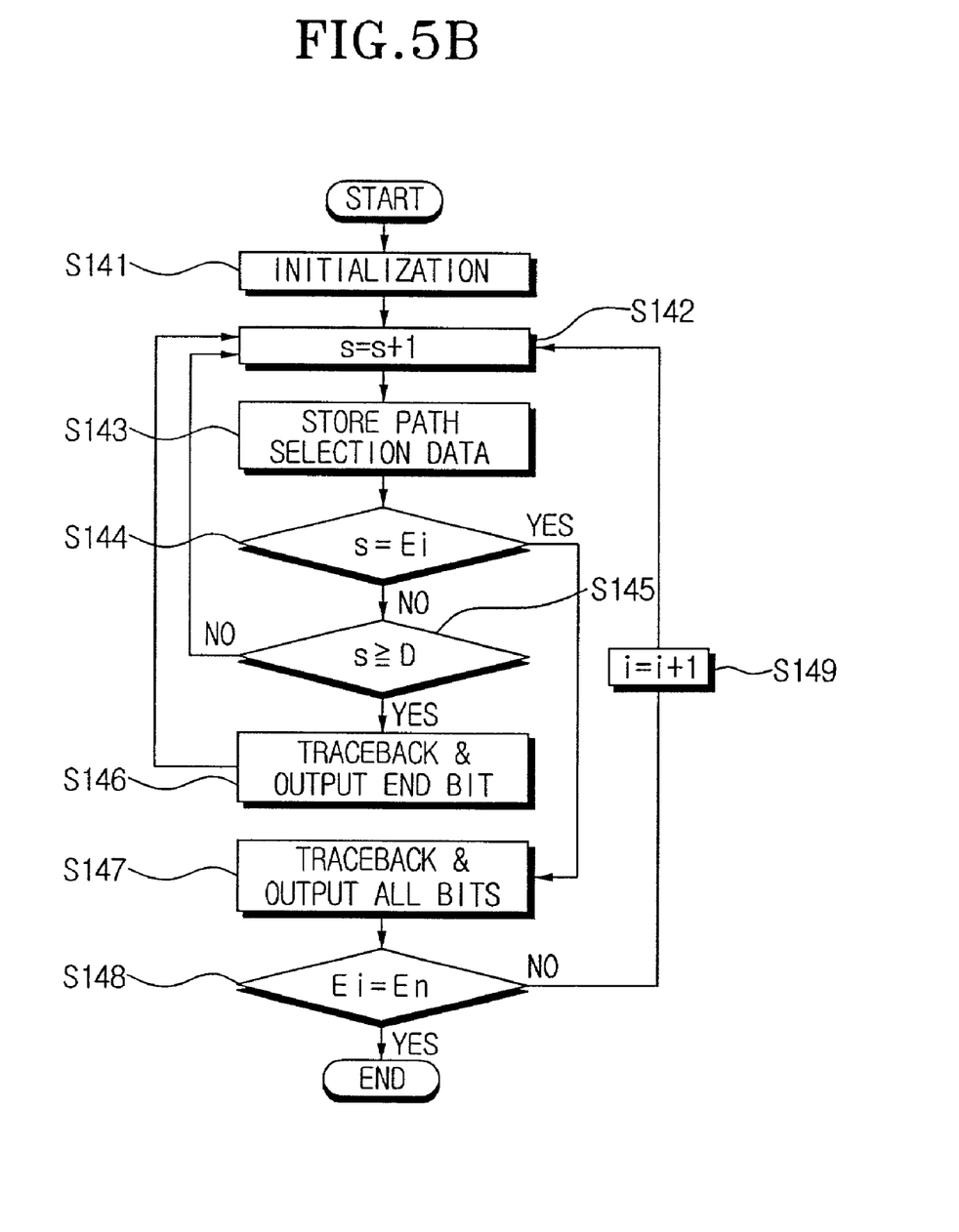
FIG. 5B is a flowchart explaining in detail the tracebacking process of FIG. 5A.

Referring now to FIG. 5B, the tracebacking step (S14) includes the sub-steps of an initializing step (step S141), a data parameter increasing step (step S142), a path selection data storing step (step S143), a frame length comparing step (step S144), a decoding depth comparing step (step S145), a first tracebacking step (step S146), a second tracebacking step (step S147), a longest frame length comparing step (step S148), and a frame length indicating parameter increasing step (step S149).

First, in the initializing step (S141), a data parameter (s) for counting the path selection data, a frame length parameter (Ei) for indicating a possible length of the frame, a frame length indicating parameter (i) for use in the parameter Ei for indicating a possible frame length, and a longest possible frame length (En) for indicating the longest possible frame length, are initialized. Provided that the total number of the possible frame lengths is (n), the frame length indicating parameter (i) varies from one (1) to (n) for counting the number of the possible frame lengths. When the frame length indicating parameter (i) is initialized, the frame length parameter (Ei) is allotted with an i-th possible frame length. After the initializing step (S141), the data parameter increasing step S142) is performed. In the path selection data storing step (S413), path selection data corresponding to the increased data parameter (s) is stored. In the frame length comparing step (S144), the increased data parameter (s) is compared with the frame length parameter (Ei). After the frame length comparing step (S144), the decoding depth comparing step (S145) is performed, comparing the data parameter (s) with the decoding depth (D) when the data parameter (s) is determined to be different from the frame length parameter (Ei) in the frame length comparing step (S144). If the data parameter (s) is determined to be smaller than the decoding depth (D) in the decoding depth comparing step (S145), the data parameter increasing step (S142) is performed.

Meanwhile, if the data parameter (s) equals to, or is greater than the decoding depth (D) in the decoding depth comparing step (S145), the first tracebacking step (S146) is performed, tracebacking the stored path selection data, outputting an end bit as the first preliminarily decoded data (PDi), and performing the data parameter increasing step (S142).

If the data parameter (s) equals to the frame length parameter (Ei) in the frame length comparing step (S144), the second tracebacking step (S147) is performed, tracebacking the stored path selection data, and sequentially outputting all the tracebacked data as the second preliminarily decoded data (PDi*). When the second tracebacking step (S147) is completed, the longest frame length comparing step (S148) is performed, comparing the frame length parameter (Ei) with the longest possible frame length (En). If the frame length parameter (Ei) equals the longest possible frame length (En) in the longest frame length comparing step (S148), the tracebacked data storing step (S14) is completed. If the frame length parameter (Ei) is different from the longest possible frame length (En), however, the frame length indicating parameter increasing step (S149) is performed, increasing the frame length indicating parameter (i). Further, the frame length indicating parameter increasing step (S149) initializes the data parameter (s), and allots the frame length parameter (Ei) with the i-th possible frame length.

Figure 6A:
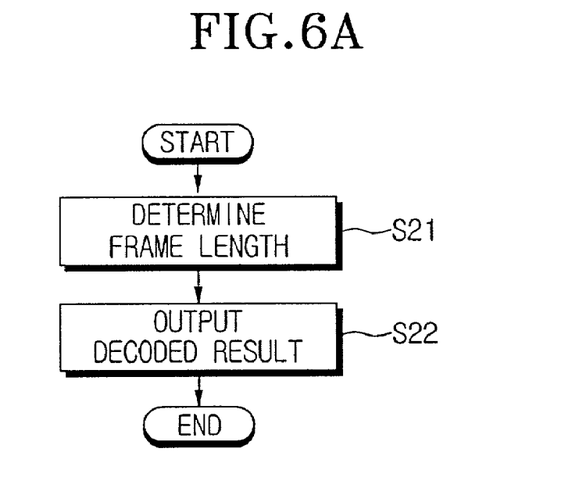
FIG. 6A is a flowchart explaining in detail the decoded data outputting process of FIG. 4.

Referring to FIG. 6A, the decoded data outputting step (S2) includes a frame length determining step (step S21) for detecting a frame length (Ek) based on the input data, and a decoding result outputting step (S22) for selectively outputting the preliminarily decoded data that correspond with the detected frame length (Ek) among the first and second preliminarily decoded data (PDi and PDi*).

The frame length determining step (S21) preferably uses a general method for detecting the frame length, i.e., the CRC, zero path metrics, and minimum path metrics.

Figure 6B:
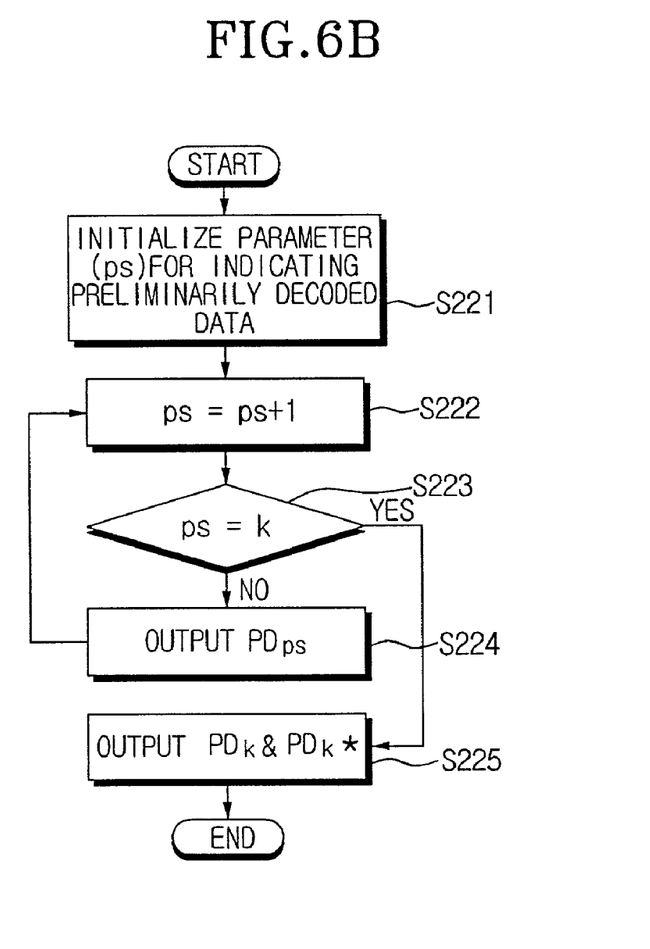
FIG. 6B is a flowchart explaining in detail the decoded data outputting process of FIG. 6A.

Referring to FIG. 6B, the decoding result outputting step (S22) includes an initializing step (S221), a parameter increasing step (S222), a constant comparing step (S223), a first decoded data outputting step (S224), and a second decoded data outputting step (S225).

In the initializing step (221), a preliminarily decoded data indicating parameter (ps) is initialized. Then the preliminarily decoded data indicating parameter (ps) is increased in the parameter increasing step (S222). Next, in the constant comparing step (S223), the increased preliminarily decoded data indicating parameter (ps) is compared with a frame length indicating constant (k) that corresponds to the detected frame length (Ek). If the increased preliminarily decoded data indicating parameter (ps) is smaller than the frame length indicating constant (k) corresponding to the detected frame length (Ek) in the comparing step (S223), the first decoded data outputting step (S224) is performed, outputting data (PDps) that are indicated by the preliminarily decoded data indicating parameter (ps) among the first preliminarily decoded data, and performing the parameter increasing step (S222). Meanwhile, if the preliminarily decoded data indicating parameter (ps) equals to the frame length indicating parameter (k) corresponding to the detected frame length (Ek), the second decoded data outputting step (S225) is performed, outputting data (PDk) that are indicated by the frame length indicating parameter (k) among the first preliminarily decoded data, and outputting data (PDk*) that are indicated by the frame length indicating parameter (k) among the second preliminarily decoded data.

Figure 7:
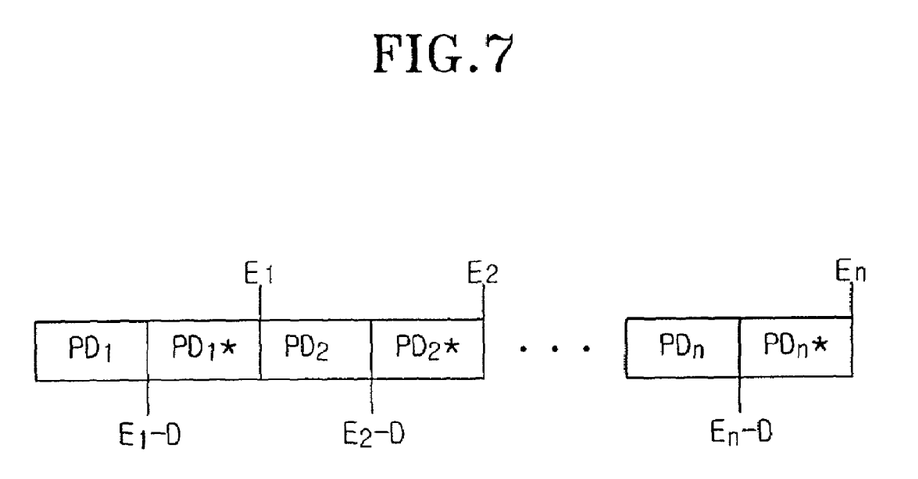
FIG. 7 is a view showing the structure of an output buffer of FIG. 3 according to a preferred embodiment of the present invention.

FIG. 7 shows an arrangement of the first and second preliminarily decoded data (PDi and PDi*) stored in the output storing part 334 according to the preferred embodiment of the present invention. PD1 and PD1* are the data decoded according to the first possible frame length (E1). PD2 and PD2* are the data decoded according to the second possible frame length (E2). PDn and PDn* are the data decoded according to the n-th possible frame length (En). Accordingly, if the frame length determined by the frame length determining part 332 is E2, then the corresponding decoded data are PD1, PD2, and PD2*.

As described above, according to the decoding apparatus and method of the present invention, even when the frame length of the data is unknown, the data can be accurately decoded. Secondly, accurate data decoding is performed without deteriorating decoding efficiency. Thirdly, the memory can be utilized more efficiently.

While the present invention has been shown and described with reference to the foregoing preferred embodiment, it will be apparent to those skilled in the art that changes in form and detail may be made therein without departing from the scope of the invention as defined in the appended claims.

What is claimed is:

1. An apparatus for decoding data of unknown frame length, comprising:
    a preliminary decoding part for decoding input data into preliminarily decoded data according to each of the possible frame lengths by outputting path selection data calculated based on the input data and a standard level and tracebacking the path selection data; and
    a decoded data outputting part for selectively outputting data that correspond to a frame length detected from the input data which has not been decoded by the preliminary decoding part, from among the preliminarily decoded data which are decoded by the preliminary decoding part according to each of the possible frame lengths.

2. The decoding apparatus of claim 1, wherein the preliminary decoding part comprises:
    a branch metrics calculating part for calculating a set of branch metrics by comparing the input data with a standard level;
    an ACS (Adding, Calculating & Selecting) part for obtaining path metrics of a current state by adding path metrics of a previous state to the set of branch metrics, and from the path metrics, selectively outputting an optimum path of the current state as path selection data;
    a path metrics storing part for storing the path metrics of the current state calculated by the ACS part;
    a tracebacked data storing part for storing the path selection data output from the ACS part, and tracebacking the path selection data, and sequentially outputting the tracebacked data as preliminarily decoded data; and
    a traceback controlling part for controlling the tracebacking of the tracebacked data storing part according to each of the possible frame lengths.

3. The decoding apparatus of claim 2, wherein the decoded data outputting part comprises:
    a frame length determining part for detecting the frame length based on the input data which has not been decoded by the preliminary decoding part;
    an output storing part for storing the preliminarily decoded data output from the tracebacked data storing part; and
    an output controlling part for controlling the output storing part so as to output decoded data corresponding to the detected frame length.

4. A method for decoding data of unknown frame length, comprising the steps of:
    (a) decoding the input data into preliminarily decoded data according to each of the possible frame lengths; and by outputting path selection data calculated based on the input data and a standard level and tracebacking the path selection data; and
    (b) selectively outputting data corresponding to the frame length detected based on the input data which has not been decoded into the preliminary decoded data, from among the preliminarily decoded data which are decoded according to each of the possible frame lengths.

5. The decoding method of claim 4, wherein the preliminarily decoding step
    (a) comprises the sub-steps of:
    (a1) calculating a set of branch metrics by comparing the input data with a standard level;
    (a2) obtaining path metrics of a current state by adding path metrics of a previous state to the set of branch metrics, and from the path metrics, selectively outputting an optimum path of the current state as path selection data;
    (a3) storing the path selection data; and
    (a4) tracebacking the path selection data according to each of the possible frame lengths, and sequentially outputting the tracebacked data as preliminarily decoded data.

6. A method for decoding data of unknown frame length, comprising the steps of:
    (a) decoding the input data into preliminarily decoded data according to each of the possible frame lengths; and
    (b) selectively outputting data corresponding to the frame length detected based on the input data, from among the preliminarily decoded data which are decoded according to each of the possible frame lengths;
    wherein the preliminarily decoding step (a) comprises the sub-steps of:
    (a1) calculating a set of branch metrics by comparing the input data with a standard level;
    (a2) obtaining path metrics of a current state by adding path metrics of a previous state to the set of branch metrics, and from the path metrics, selectively outputting an optimum path of the current state as path selection data;
    (a3) storing the path selection data; and
    (a4) tracebacking the path selection data according to each of the possible frame lengths, and sequentially outputting the tracebacked data as preliminarily decoded data; and
    wherein the tracebacking step (a4) comprises the sub-steps of:
    (a41) initializing a data parameter for counting the path selection data, a frame length parameter for indicating the possible frame lengths, and frame length indicating parameter for use in the frame length parameter indicating the possible frame lengths;
    (a42) increasing the data parameter;
    (a43) storing a path selection data corresponding to the data parameter;

(a44) comparing the data parameter with the frame length parameter;

(a45) if the data parameter is different from the frame length parameter, comparing the data parameter with a decoding depth, and, if the data parameter is smaller than the decoding depth, performing the data parameter increasing sub-step (a42);

(a46) if the data parameter equals to, or is greater than the decoding depth, firstly tracebacking the path selection data, and sequentially outputting a lastly tracebacked bit of the data as first preliminarily decoded data, and performing the data parameter increasing sub-step (a42);

(a47) if the data parameter equals the frame length parameter, secondly tracebacking the path selection data, and sequentially outputting all the tracebacked bits of data as second preliminarily decoded data;

(a48) after completion of the sub-step (a47), comparing the frame length parameter with a longest possible frame length, and, if the frame length parameter equals the longest possible frame length, ending the tracebacking step (a4); and (a49) if the frame length parameter is different from the longest possible frame length, increasing the frame length indicating parameter, and performing the data parameter increasing sub-step (a42).

7. The decoding method of claim 6, wherein the decoded data outputting step(b) comprises the sub-steps of:

(b1) detecting a frame length from the input data; and (b2) among the first and second preliminarily decoded data output in the sub-steps (a46 and a47), selectively outputting data corresponding to the detected frame length, as final decoded data.

8. The decoding method of claim 7, wherein the frame length determining sub-step (b 1) detects the frame length by using one of a Cyclic Redundancy Check, a zero path metric, and a minimum path metric.

9. The decoding method of claim 7, wherein the decoded data outputting step (b2) comprises the sub-steps of:

(b21) initializing a preliminarily decoded data indicating parameter;

(b22) increasing the preliminarily decoded data indicating parameter;

(b23) if the preliminarily decoded data indicating parameter is smaller than the detected frame length, selectively outputting the data, among the first preliminarily decoded data, that are indicated by the preliminarily decoded data indicating parameter, and performing the preliminarily decoded data indicating parameter increasing sub-step (b22); and (b24) if the preliminarily decoded data indicating parameter equals to the detected frame length, selectively outputting the data, among the first and the second preliminarily decoded data, that are indicated by the frame length indicating parameter.

10. An apparatus for decoding data of unknown frame length, comprising:

a preliminary decoding part for decoding input data into preliminarily decoded data according to each of the possible frame lengths by outputting path selection data calculated based on the input data and a standard level and tracebacking the path selection data; and a decoded data outputting part for selectively outputting data that correspond to a frame length detected from the input data which has not been decoded by the preliminary decoding part.

* * * * *